US006967380B2

(12) United States Patent
Breitwisch et al.

(10) Patent No.: US 6,967,380 B2
(45) Date of Patent: Nov. 22, 2005

(54) CMOS DEVICE HAVING RETROGRADE N-WELL AND P-WELL

(75) Inventors: Matthew J. Breitwisch, Essex Junction, VT (US); Chung H. Lam, Williston, VT (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 10/722,867

(22) Filed: Nov. 26, 2003

(65) Prior Publication Data

US 2004/0157418 A1    Aug. 12, 2004

Related U.S. Application Data

(62) Division of application No. 10/063,406, filed on Apr. 19, 2002, now Pat. No. 6,667,205.

(51) Int. Cl.[7] .................. H01L 29/76; H01L 29/94; H01L 31/062; H01L 31/113; H01L 31/119
(52) U.S. Cl. .............. 257/371; 257/372; 257/391; 257/392; 257/402
(58) Field of Search ................ 257/371–372, 257/391–392, 402

(56) References Cited

U.S. PATENT DOCUMENTS

| 4,558,508 A | 12/1985 | Kinney et al. ............... 29/571 |
| 4,613,885 A | 9/1986 | Haken ........................ 357/42 |
| 4,929,565 A | 5/1990 | Parrillo ...................... 437/34 |
| 5,138,420 A | 8/1992 | Komori et al. ............... 357/42 |
| 5,304,833 A | 4/1994 | Shigeki et al. .............. 257/372 |
| 5,384,279 A | 1/1995 | Stolmeijer et al. ........... 437/57 |
| 5,413,945 A * | 5/1995 | Chien et al. ................. 438/217 |
| 5,494,843 A | 2/1996 | Huang ......................... 437/56 |
| 5,736,416 A * | 4/1998 | Johansson .................... 438/302 |
| 5,792,680 A | 8/1998 | Sung et al. .................. 438/210 |

(Continued)

FOREIGN PATENT DOCUMENTS

JP    3-99430    4/1991

OTHER PUBLICATIONS

W.S. Johnson, "Multiple Masking Technique In Ion Implantation", IBM TDB vol. 15, No. 2 Jul. 1972, pp. 660-661.

*Primary Examiner*—Amir Zarabian
*Assistant Examiner*—Ida M. Soward
(74) *Attorney, Agent, or Firm*—Anthony J. Canale

(57) ABSTRACT

A method of forming retrograde n-wells and p-wells. A first mask is formed on the substrate and the n-well implants are carried out. Then the mask is thinned, and a deep p implant is carried out with the thinned n-well mask in place. This prevents Vt shifts in FETs formed in the n-well adjacent the nwell-pwell interface. The thinned mask is then removed, a p-well mask is put in place, and the remainder of the p-well implants are carried out.

9 Claims, 2 Drawing Sheets

U.S. PATENT DOCUMENTS

| | | | |
|---|---|---|---|
| 5,814,866 A | 9/1998 | Borland | 257/369 |
| 5,963,799 A | 10/1999 | Wu | 438/199 |
| 6,144,076 A | 11/2000 | Puchner et al. | 257/369 |
| 6,157,064 A * | 12/2000 | Huang | 257/344 |
| 6,235,568 B1 | 5/2001 | Murthy et al. | 438/231 |
| 6,258,641 B1 | 7/2001 | Wong et al. | 438/199 |
| 6,271,551 B1 * | 8/2001 | Schmitz et al. | 257/288 |
| 6,300,819 B1 * | 10/2001 | De et al. | 327/534 |
| 6,312,981 B1 | 11/2001 | Akamatsu et al. | 235/380 |
| 6,329,260 B1 * | 12/2001 | DeJong et al. | 438/318 |
| 6,417,547 B2 * | 7/2002 | Kang | 257/369 |
| 6,462,385 B1 * | 10/2002 | Kumagai | 257/372 |

* cited by examiner

CMOS DEVICE HAVING RETROGRADE N-WELL AND P-WELL

This application is a divisional of Ser. No. 10/063,406; filed on Apr 19, 2002 now U.S. Pat. No. 6,667,205.

BACKGROUND OF THE INVENTION

The invention relates generally to CMOS devices, and more particularly to forming discrete p-wells for the n-type devices.

In CMOS technology, it is generally known to utilize a "twin tub" process to form a discrete, p-type well region (hereafter "p-well") into which the NFET will be formed, and a discrete, n-type well region ("n-well") into which the PFET will be formed. The wells are used to more precisely control the threshold voltages of the transistors. See for example U.S. Pat. No. 5,792,680, "Method of Forming a Low Cost DRAM Cell with Self-Aligned Twin Tub CMOS Devices and a Pillar Shaped Conductor," to Sung et al. As shown in FIGS. 5A–5G of the patent, an n-well and p-well are formed using a composite imaged structure of BPSG 16 and silicon nitride 18. First the p-type dopant is implanted so that it is shallower beneath the mask structure and deeper in areas where the mask structure is absent, then the n-type dopant is implanted at an energy such that it does not implant into unmasked areas. Both implants are carried out at a concentration of 1E13 to 1E14 and an energy of 1–2 Mev.

More recently, twin tub CMOS devices have utilized so-called "retrograde" wells, in which the concentration of dopant is higher at the bottom of the well and lower at the upper surface of the well. This doping profile helps prevent latch up by raising the threshold voltage of the parasitic device formed by the well. An example of prior art retrograde wells is shown in FIG. 1 of U.S. Pat. No. 5,814,866. Photoresist defines a p-well region, and a sequence of implants is carried out to form first the deep, highly doped portion of the p-well (implant concentration 1E13, energy 2 Mev), then the more shallow, more lightly doped portions of the well (e.g. 1.25 Mev, 1 Mev). Note again that a p-region forms below the mask that is shallower than where the substrate is unmasked. Then arsenic ions are implanted to form the n-well, again in a sequence with decreasing energy, to form a retrograded n-well with the mask in place.

In forming twin-tub, 0.11 um lithography CMOS devices (that is, FETs with effective channel lengths less than or equal to approximately 0.11 um), the inventors found that the threshold voltages of n-type transistors within about 1.5 um of the p-well/n-well interface exhibited threshold voltage shifts of up to 80 mV. Repeated attempts to address this threshold voltage shift by altering the implant dose and/or energy proved unsuccessful. While these threshold voltage shifts could be reduced to some extent by altering doping profiles, they were not eliminated or reduced to an acceptable level (i.e. less than about 10 mV). Moreover, these solutions created new problems. The altered doping profiles decreased the efficiency of the resulting well regions. These shifts in threshold voltage could lead to catastrophic failures in the Boolean operations of the resulting logic circuits.

BRIEF SUMMARY OF THE INVENTION

It is thus an object of the present invention to form twin-tub CMOS devices that do not exhibit threshold voltage shifts in devices adjacent the p-well/n-well interface.

In a first aspect, the invention comprises a method of forming the n-well and p-well regions on a substrate, comprising the steps of forming a first mask structure having a given thickness on the substrate; carrying out n-well implants into regions of the substrate exposed by the first mask structure; substantially reducing said thickness of said first mask structure; carrying out a first p-well implant through said first mask structure, so that a first implant region is formed below the n-well and a second implant region is formed below the first mask structure, the first implant region being deeper than the second implant region; forming a second mask structure on the substrate having an image generally complementary to the first mask structure; and carrying out p-well implants into regions of the substrate exposed by the second mask structure.

In a second aspect, the invention comprises a method of forming abutting retrograde n-well and p-well regions on a substrate, comprising the steps of forming the retrograde n-well by implanting with a first dopant species; and forming the retrograde p-well by first carrying out a deep implant with a second dopant species under conditions that substantially reduce scattering of said second dopant species into abutting regions of said retrograde n-well.

In a third aspect, the invention comprises a CMOS device having FETs with effective channel lengths less than or equal to approximately 0.11 um formed in adjacent, retrograde nwells and pwells, wherein threshold voltages of FETs formed with approximately 1.5 um of an interface between said nwells and pwells are constant within approximately 10 mV.

BRIEF DESCRIPTION OF THE SEVERAL VIEWS OF THE DRAWINGS

The foregoing and other aspects of the invention will be described in more detail below with reference to the accompanying drawing, in which.

DETAILED DESCRIPTION OF THE INVENTION

In further investigations, the present inventors determined that these threshold shifts (within approximately 1.5 um of the p-well/n-well interface) were due to scattering of boron ions during the formation of the deep, heavily-doped portion of the retrograde p-well. Specifically, it was determined that the photoresist mask scattered boron ions off-vertical into adjacent portions of the n-well. Therefore, the inventors established the present process, which provides appropriate masking for the respective wells during formation, but does not induce boron scattering during the deep well implant.

Figure 1:
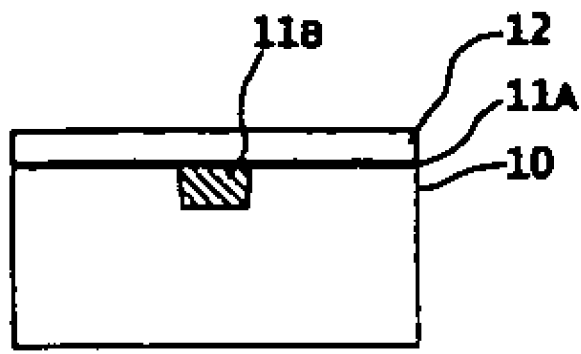
FIGS. 1–5 are cross sectional views of a semiconductor substrate fabricated in accordance with a preferred embodiment of the present invention.

With reference to FIG. 1, a 200 nanometer (nm) layer of polycrystalline silicon (polysilicon) 12 is deposited on a semiconductor substrate 10. The substrate 10 can be silicon, silicon-germanium, gallium arsenide, or any other semiconductor base in which CMOS devices can be formed. Typically the twin tubs are formed in the substrate 10 after isolation regions 11B (for example, shallow trench isolation) have been formed, Further, immediately prior to the sequence of steps described herein, a protection layer 11A such as a thin oxide (for example, if the substrate is silicon, silicon oxide about 60 angstroms thick) is preferably grown on the substrate. The polysilicon layer 12 can be made of other materials (such as silicon nitride and silicon oxide) that can be deposited and etched in the same manner as the polysilicon layer 12, as described in more detail below. The polysilicon layer 12 is preferably of a thickness of approximately 100–300 nm. Other thicknesses could be used.

Figure 2:
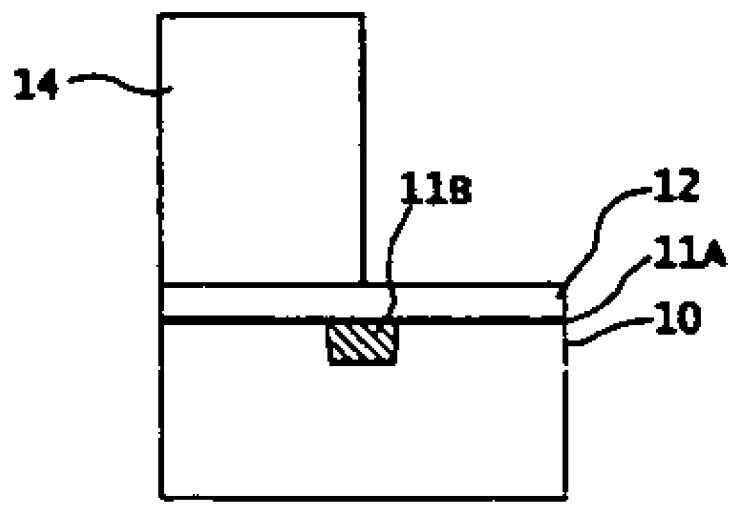

A 2000 nm thick layer of photoresist 14 is then deposited and patterned on substrate 10, to provide photomask 14 as shown in FIG. 2. Note that at this juncture, the polysilicon 12 is not patterned. This is so it can protect substrate 10 from damage during the ion implantation steps described below. As a result, a combined masking structure of 2000 nm of photoresist 14 and 200 nm polysilicon 12 define an area of the substrate where the n-well is to be formed. In practice the photoresist layer 14 is typically 1800–2500 nm in thickness. Other thicknesses could be used.

Figure 3:
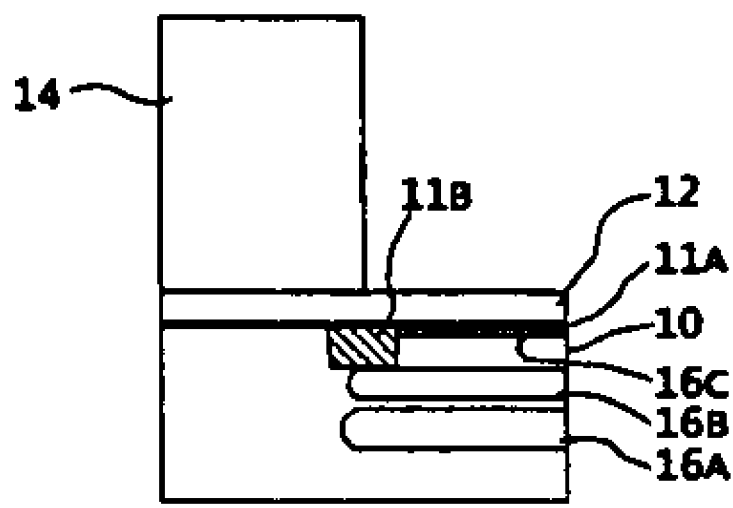

Subsequently, as shown in FIG. 3, a series of implant steps are carried out to define the retrograde n-well 16, comprising a deep high dose implant 16A at an energy of 850,000 electron volts, and a dosage of 5.2 times 10 to the 13th energy per square centimeter (as abbreviated hereafter, 850 kEv, $5.2 \times 10 e E 13$ per $cm^2$), intermediate dose implant 16B (50 kEv, $1.25 \times 10 E 12$ per $cm^2$) and low dose implant 16A (50 kEv, $5 \times 10 E 11$ per $cm^2$), all of phosporous (arsenic could also be used, with appropriate changes in the doses and energies). Note that during this set of implant steps the photoresist is thick enough to prevent ions from substantially penetrating through the polysilicon layer 12. A final, shallower implant could also be carried out to more precisely control dopant levels at the surface of substrate 10. Obviously the powers and dosage densities can be varied, so long as the overall implant profile (featuring deep high dose implant, intermediate dose implant, and shallow lower dose implant) is provided. Moveover, additional implants could be added.

Figure 4:
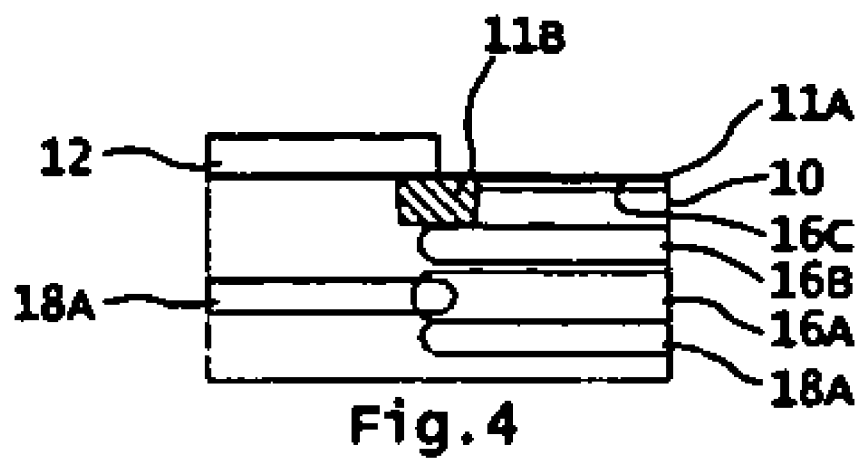

Then, as shown in FIG. 4, the exposed portion of the layer 12 is removed (preferably by reactive ion etching in a bromine or chlorine-based ambient), and photoresist 14 is removed by plasma etching in an oxygen environment so that a portion of the polysilicon layer 12 remains. Then a boron implant is done at 550 kEv, $2.5 \times 10 E 14$ per $cm^2$ to form a deep p-type implant region 18A. The present inventors have found that by doing this deep implant in the presence of a relatively thin masking material (the 200 nm polysilicon 12), boron scattering during this implant step is substantially eliminated. The threshold voltages of the NFETs formed in the p-well do not vary as a function of distance from the p-well/n-well interface. Specifically, experimental results showed that threshold voltage shifts of FETs formed within approximately 1.5 um of the interface between the n-well and the p-well, as compared to FETs formed elsewhere, were either zero or negligible (not greater than 10 mV). Note also that this dosage and energy of boron results in a portion of region 18A immediately below the deepest n-well implant 16A which decreases junction capacitance and hence enhances the switching speed of the resulting transistors.

Figure 5:
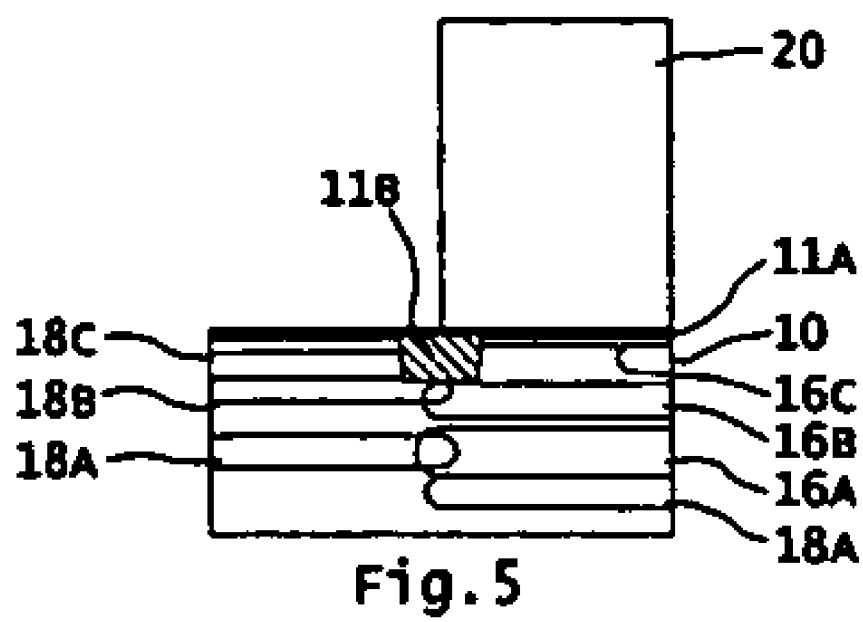

Finally, as shown in FIG. 5, the polysilicon layer 12 is stripped, a new photoresist between 1800–2500 nm is deposited and imaged to form a second implant blocking mask 20. An intermediate dose implant 18B (150 kEv, $1.25 \times 10 E 12$ per $cm^2$) and low dose implant 18C (45 kEv, $5 \times 10 E 11$ per $cm^2$) are provided to define the retrograde p-well 18. Again, a final, shallower implant could also be carried out to more precisely control dopant levels at the surface of substrate 10. Again, the dosages and number of implants can be varied as in the case of the n-well 16 as described above. The inventors found that at these dosages and powers there was no evidence of boron scattering, hence the thicker implant blocking mask 20 can be used. FETs (not shown) are subsequently formed in the respective wells to provide the final CMOS device.

As will be apparent to those of ordinary skill in the art, various modifications may be made to the structures and teachings set forth above without departing from the spirit and scope of the invention as described and claimed. For example, polysilicon 12 can be made of other materials and can be other thicknesses. Moreover, materials other than conventional photoresist could be used to provide the thick implant mask, such as other cross linkable polymers such as polyimide. Finally, instead of forming the mask structure from two separate layers, the results of the invention could be achieved by using a single layer that is thick when carrying out the n-well implants and is then thinned to carry out the deep p-well implant. As a practical matter such an alternate embodiment would not include retaining a portion of the masking layer to prevent implant damage during formation of the n-well.

What is claimed is:

1. A CMOS device having FETs with effective channel lengths less than or equal to approximately 0.11 um formed in adjacent, retrograde nwells and pwells, wherein threshold voltages of FETs formed with approximately 1.5 um of an interface between said nwells and pwells are constant within approximately 10 mV.

2. The CMOS device of claim 1, wherein p-type dopant regions are located immediately below said retrograde nwells.

3. The CMOS device of claim 1, wherein said retrograde nwells comprise a first n-type dopant region having a first dopant level, a second n-type dopant region immediately above said first n-type dopant region and having a second dopant level, and a third n-type dopant region immediately above said second n-type dopant region and having a third dopant level.

4. The CMOS device of claim 3, wherein the first dopant level is greater than the second dopant level.

5. The CMOS device of claim 4, wherein the second dopant level is greater than the third dopant level.

6. The CMOS device of claim 5 further comprising a p-type dopant region immediately below the first n-type dopant region.

7. The CMOS device of claim 1, wherein said retrograde pwells comprise a first p-type dopant region having a first dopant level, a second p-type dopant region immediately above said first p-type dopant region and having a second dopant level, and a third p-type dopant region immediately above said second p-type dopant region and having a third dopant level.

8. The CMOS device of claim 3, wherein said retrograde pwells comprise a first p-type dopant region having a first dopant level, a second p-type dopant region immediately above said first p-type dopant region and having a second dopant level, and a third p-type dopant region immediately above said second p-type dopant region and having a third dopant level.

9. The CMOS device of claim 8, wherein said first p-type dopant region is located substantially adjacent to said first n-type dopant region.

* * * * *